US008212697B2

(12) United States Patent
Jansson et al.

(10) Patent No.: US 8,212,697 B2
(45) Date of Patent: Jul. 3, 2012

(54) METHODS OF AND ARRANGEMENTS FOR OFFSET COMPENSATION OF AN ANALOG-TO-DIGITAL CONVERTER

(75) Inventors: Christer Jansson, Linkoping (SE); Rolf Sundblad, Ljungsbro (SE)

(73) Assignee: CSR Technology Inc., Sunnyvale, CA (US)

( * ) Notice: Subject to any disclaimer, the term of this patent is extended or adjusted under 35 U.S.C. 154(b) by 149 days.

(21) Appl. No.: 12/815,882

(22) Filed: Jun. 15, 2010

(65) Prior Publication Data

US 2011/0304489 A1     Dec. 15, 2011

(51) Int. Cl.
*H03M 1/06* (2006.01)

(52) U.S. Cl. .......... 341/118; 360/51; 704/200; 370/516; 327/248; 375/316; 375/232; 375/229

(58) Field of Classification Search .......... 341/140–160; 375/232–371; 360/51; 704/200; 370/516, 370/327, 248, 361
See application file for complete search history.

(56) References Cited

U.S. PATENT DOCUMENTS

| 5,262,779 | A | 11/1993 | Sauer |
| 5,272,481 | A | 12/1993 | Sauer |
| 5,585,796 | A | 12/1996 | Svensson et al. |
| 6,392,575 | B1 * | 5/2002 | Eklund ........................ 341/141 |
| 6,522,285 | B2 * | 2/2003 | Stolarczyk et al. ............. 342/22 |
| 7,012,983 | B2 * | 3/2006 | Buchwald et al. ............ 375/373 |
| 7,058,150 | B2 * | 6/2006 | Buchwald et al. ............ 375/355 |
| 7,245,638 | B2 * | 7/2007 | Agazzi et al. ................. 370/516 |
| 7,286,597 | B2 * | 10/2007 | Buchwald et al. ............ 375/232 |
| 7,336,729 | B2 * | 2/2008 | Agazzi ......................... 375/316 |
| 7,352,316 | B2 * | 4/2008 | Hori et al. ..................... 341/155 |
| 7,693,214 | B2 * | 4/2010 | Shida ............................ 375/232 |
| 7,778,286 | B2 * | 8/2010 | Agazzi et al. ................. 370/516 |
| 7,852,913 | B2 * | 12/2010 | Agazzi et al. ................. 375/229 |

FOREIGN PATENT DOCUMENTS

| EP | 0 798 864 | 5/2002 |
| WO | 92/01336 | 1/1992 |

* cited by examiner

*Primary Examiner* — Lam T Mai
(74) *Attorney, Agent, or Firm* — Lando & Anastasi, LLP

(57) ABSTRACT

An arrangement is disclosed for offset compensation of a time-interleaved analog-to-digital converter, having a plurality of computing channels and being adapted to convert a signal from an analog domain to a digital domain. The arrangement comprises the time-interleaved analog-to-digital converter, an analog offset estimation and compensation unit adapted to estimate a mean offset for the plurality of computing channels, a digital offset estimation and compensation unit adapted to estimate a residual computing channel specific offset for each of the plurality of computing channels, and offset compensation means. The offset compensation means are adapted to perform offset compensation in the analog domain of each of the plurality of channels based on the estimated mean offset in the analog domain, and to perform offset compensation in the digital domain of each of the plurality of channels based on respective residual computing channel specific offset.

33 Claims, 4 Drawing Sheets

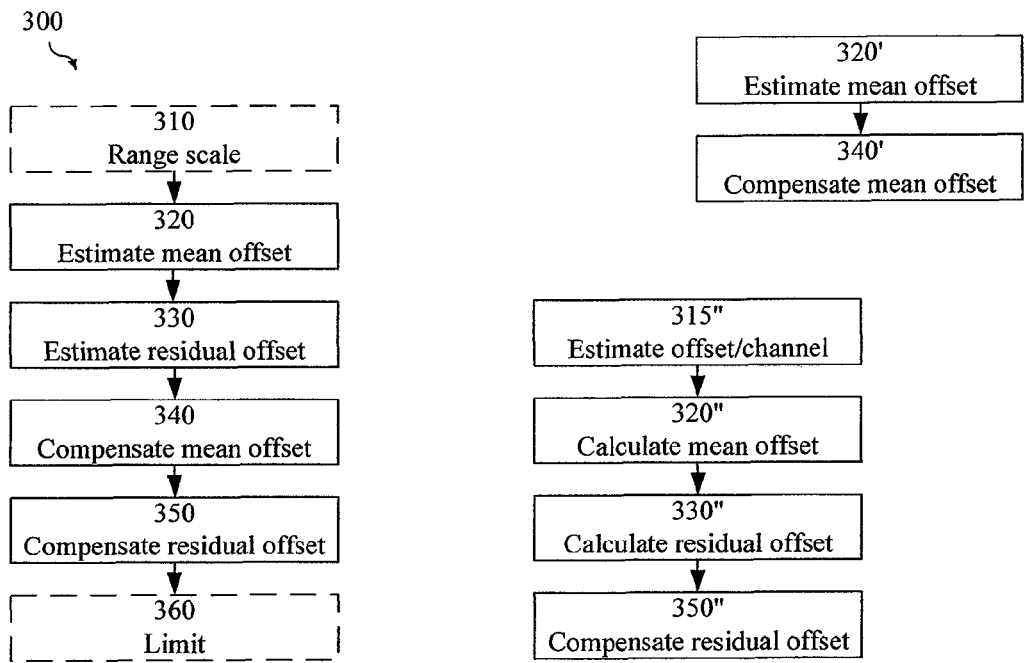
Fig. 3
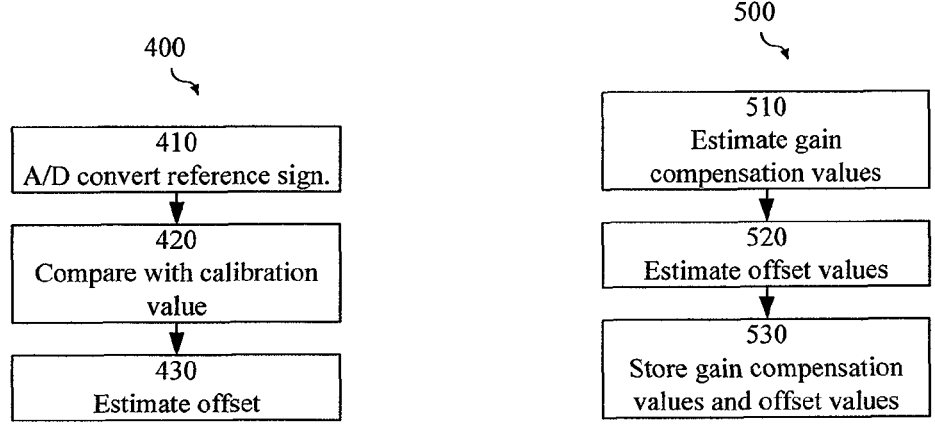
Fig. 4
Fig. 5

METHODS OF AND ARRANGEMENTS FOR OFFSET COMPENSATION OF AN ANALOG-TO-DIGITAL CONVERTER

TECHNICAL FIELD

The present invention relates generally to the field of analog-to-digital converters (ADC). More particularly, it relates to offset compensation of analog-to-digital converters.

BACKGROUND

Electronic equipment (such as, for example, television sets, other audio/video equipments, mobile telephones and personal computers) may nowadays commonly be implemented using digital technology instead of analog technology. It may be both easier and cheaper to design digital systems than analog systems. Further, it may be possible with digital technology to achieve bandwidth reductions and to apply data compression (which may reduce the necessary storage area) and error correction coding (which may yield better signal quality). The more advanced the digital applications get, the more demanding the task of converting an analog signal to a digital signal becomes. Digital video is one example of such a demanding application. For example, digital video may require a very high sampling frequency (e.g. up to around 330 MHz) and/or very high resolution (e.g. up to around 12 bit).

Analog-to-digital converters (A/D converters or ADCs) in general are well known in the art as well as their basic functionality (sample-and-hold, quantization). As the required sampling frequency increases it may be necessary to use ADC structures comprising several constituent ADCs to be able to accommodate the high sampling frequency. Examples of such ADC structures are pipe-lined ADCs and time-interleaved ADCs (e.g. a parallel successive ADC). As an example, U.S. Pat. No. 5,585,796 discloses a time-interleaved ADC for A/D converting a high-frequency analogue signal into a series of digital signals with a high sampling rate. Another example of a time-interleaved ADC is disclosed in EP 0 798 864 B1 and in WO 92/01336 A1.

FIG. 1 illustrates an example time-interleaved ADC 100. The time-interleaved ADC 100 comprises a plurality of constituent ADCs 101, 102, 103, each of which is fed an analog signal as shown at 110. Each of the constituent ADCs may perform conventional ADC operations (sample-and-hold, quantization).

A sample clock 120 controls, via a suitable number of delay elements 122, 123, the sampling phase of each of the constituent ADCs, such that the plurality of constituent ADCs 101, 102, 103 operates cyclically on the analog signal. The time-interleaved ADC 100 also comprises a multiplexer (MUX) 130 that combines the results from the plurality of constituent ADCs to a single data stream.

In this way, a higher sampling frequency may be maintained than what would have been possible with one of the constituent ADCs. If there are M constituent ADCs, then the sampling frequency may be increased by a factor of M.

FIG. 2 schematically illustrates an example video signal 200. The example video signal 200 may, for example, be used as the analog signal input 110 to the example time-interleaved ADC 100 of FIG. 1.

The example video signal 200 comprises information-bearing portions 211, 212, and portions 221, 222, 223 having a reference signal level 220. The information-bearing portions of the video signal should reside in an interval between a black level 230 and a maximum signal level 240. The reference level 220 may or may not be equal to the black level 230.

For proper representation of the video signal on, for example, a screen, it is important that the black level 230 and the maximum signal level 240 are properly controlled during the analog-to-digital conversion of the video signal.

If the black level is not maintained a signal offset results, which may, for example, cause the representation of the video signal to be too bright, too dark, or to have an incorrect bias towards any of the color components (red, blue, green).

If the relation between the maximum signal level and the black level is not maintained a gain offset results, which may, for example, result in the potential signal range not being used to its full potential and/or cause clipping phenomena.

When ADC structures comprising a plurality of constituent ADCs are used, a further problem arises, due to matching imperfections between components of the different constituent ADCs. This means that the gain and offset may vary between the different constituent ADCs. To have a proper representation of the video signal, it is quite important that such mismatch is properly compensated for.

Gain and offset compensation (both overall and per constituent ADC) are thus of importance in time-interleaved ADCs.

An example of offset compensation in a time-interleaved ADC is disclosed in EP 0 798 864 B1 and in WO 92/01336 A1. The disclosed offset compensation requires quite a few analog circuits for its implementation. Further, extra clock cycles are needed to perform the offset compensation, which means that additional constituent ADCs are required to achieve a certain sampling frequency. In EP 0 798 864 B1 and in WO 92/01336 A1, compensation is performed for offset in a respective comparator enclosed within each constituent ADC. Thus, offsets in other parts of the entire (e.g. with reference to an input signal) analog signal chain (such as offset in clamping or in an amplifier preceding the time-interleaved ADC) cannot be compensated for.

An alternative approach to offset compensation is to do the offset compensation in the digital domain. By performing offset compensation in the digital domain, less analog complexity is required. Digital implementations are also more stable and predictable than analog implementations. Furthermore, digital circuits are fully scalable in relation to new and smaller process geometries.

A problem with doing the offset compensation in the digital domain is that the effective signal range decreases after the compensation. If, for example, one of the constituent ADCs is offset compensated by +0.5% and another one of the constituent ADCs is offset compensated by −0.3%, the effective signal range decreases by 0.8%. A decrease in the effective signal range may be detrimental to the performance of succeeding circuitry, as such circuitry may expect a certain effective signal range. Inefficient use of the signal range can also be detrimental to the precision of the representation. Thus, in particular for high definition applications, it may be of importance to obtain an efficient use of the signal range.

For those and other reasons, there is a need for improved methods and arrangements for offset compensation of analog-to-digital converters.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of the invention to obviate at least some of the above disadvantages and to provide methods and arrangements for offset compensation of analog-to-digital converters.

According to a first aspect of the invention, this is achieved by a method of offset compensation of a time-interleaved analog-to-digital converter, having a plurality of computing channels and being adapted to convert a signal from an analog domain to a digital domain. The method comprises estimating a mean offset for the plurality of computing channels, estimating a residual computing channel specific offset for each of the plurality of computing channels, performing offset compensation in the analog domain of each of the plurality of channels based on the estimated mean offset in the analog domain, and performing offset compensation in the digital domain of each of the plurality of channels based on respective residual computing channel specific offset.

In some embodiments, the method may further comprise scaling the signal range based on a scaling value dependent on a maximum offset compensation before performing offset compensation in the digital domain.

In some embodiments, signal range scaling may be advantageous for correcting offset in analog and/or digital domain with target codes just at, close to, or beyond the ADC signal range limits, for example, a target code equal to zero. The target code may be defined as the signal level aimed for in the offset compensation.

In some embodiments, the method may further comprise scaling the signal range based on a scaling value dependent on a reference signal level before performing offset compensation in the analog domain.

In some embodiments, the method may further comprise shifting the signal range based on a shift value dependent on a reference signal level before performing offset compensation in the analog domain.

In some embodiments, the method may further comprise limiting the signal range after performing offset compensation in the digital domain. The signal range may be limited symmetrically around a mid code. The limited signal range may be shifted such that the shifted, limited signal range starts at a starting value. The starting value may be a fixed, non-negative value.

In some embodiments, the step of estimating the mean offset for the plurality of computing channels may be performed in association with a process of producing the time-interleaved analog-to-digital converter.

In some embodiments, the step of estimating the mean and residual offsets for the plurality of computing channels may comprise (for each of the plurality of computing channels): analog-to-digital converting a reference signal and comparing a calibration value with the analog-to-digital converted reference signal. The step of estimating the mean and residual offsets for the plurality of computing channels may also comprise estimating the mean and residual offsets based on a result of the comparisons.

In some embodiments, the method may further comprise turning off a current clamping during the steps of analog-to-digital converting a reference signal and comparing a calibration value with the analog-to-digital converted reference signal.

In some embodiments, the method may further comprise estimating, in association with a process of producing the time-interleaved analog-to-digital converter, a gain compensation value for each of a plurality of gain settings of the time-interleaved analog-to-digital converter, and performing gain compensation of the time-interleaved analog-to-digital converter based on the estimated gain compensation values and a current gain setting.

A second aspect of the invention is an arrangement for offset compensation of a time-interleaved analog-to-digital converter, having a plurality of computing channels and being adapted to convert a signal from an analog domain to a digital domain. The arrangement comprises the time-interleaved analog-to-digital converter, an analog offset estimation and compensation unit adapted to estimate a mean offset for the plurality of computing channels, a digital offset estimation and compensation unit adapted to estimate a residual computing channel specific offset for each of the plurality of computing channels, and offset compensation means. The offset compensation means are adapted to perform offset compensation in the analog domain of each of the plurality of channels based on the estimated mean offset in the analog domain, and perform offset compensation in the digital domain of each of the plurality of channels based on respective residual computing channel specific offset.

In some embodiments, the analog offset estimation and compensation unit may comprise an offset integration unit adapted to determine the mean offset by integration, a settling check unit adapted to determine whether the mean offset has converged, and a loop gain correction unit adapted to determine one or more integration parameters associated with the offset integration unit.

In some embodiments, the arrangement may further comprise an update timing controller adapted to determine an update time for the mean offset value.

In some embodiments, the arrangement may further comprise an amplifier preceding the time-interleaved analog-to-digital converter, and the offset compensation means may comprise an offset digital-to-analog converter having an input connected to an output of the analog offset estimation and compensation unit and an output connected to an input of the amplifier for performing offset compensation in the analog domain.

In some embodiments, the arrangement may further comprise a first memory having stored thereon a gain compensation value, estimated in association with a process of producing the time-interleaved analog-to-digital converter, for each of a plurality of gain settings of the amplifier, and gain compensation means adapted to perform gain compensation of the time-interleaved analog-to-digital converter based on the estimated gain compensation values and a current gain setting.

In some embodiments, the offset compensation means may comprise an adder having an input connected to an output of the digital offset estimation and compensation unit and another input associated with an output of the time-interleaved analog-to-digital converter for performing offset compensation in the digital domain.

In some embodiments, the arrangement may further comprise a range scaler associated with an output of the time-interleaved analog-to-digital converter, with an input of the analog offset estimation and compensation unit and with an input of the digital offset estimation and compensation unit, and adapted to scale the signal range based on a scaling value dependent on a maximum offset compensation in the digital domain.

In some embodiments, the arrangement may further comprise a signal range limiter associated with an output of the digital offset estimation and compensation unit.

In some embodiments, the arrangement may further comprise a comparing unit adapted to compare a calibration value with an analog-to-digital converted reference signal. In such embodiments, the analog offset estimation and compensation unit may be adapted to estimate the mean offset based on an output of the comparing unit, and the digital offset estimation and compensation unit may be adapted to estimate the residual computing channel specific offset based on an output of the comparing unit.

In some embodiments, the arrangement may further comprise a current clamping, and a current clamping controller adapted to turn off the current clamping during the comparison by the comparing unit of the calibration value with the analog-to-digital converted reference signal.

In some embodiments, the arrangement may further comprise a bypass switch for bypassing the analog offset estimation and compensation unit, and the digital offset estimation and compensation unit may be adapted, when the bypass switch is in a state to bypass the analog offset estimation and compensation unit, either to: estimate a total computing channel specific offset for each of the plurality of computing channels; and perform offset compensation in the digital domain of each of the plurality of channels based on respective total computing channel specific offset; or to estimate a residual computing channel specific offset for each of the plurality of computing channels; and perform offset compensation in the digital domain of each of the plurality of channels based on respective residual computing channel specific offset.

In some embodiments, the arrangement may further comprise a second memory having stored thereon offset values, estimated in association with a process of producing the time-interleaved analog-to-digital converter, and a first stored values switch for feeding the analog offset estimation and compensation unit with the stored offset values, and/or a second stored values switch for feeding the digital offset estimation and compensation unit with the stored offset values. The analog offset estimation and compensation unit may be adapted to, when the first stored values switch is in a state to feed the analog offset estimation and compensation unit with the stored offset values, perform offset compensation of the time-interleaved analog-to-digital converter in the analog domain based on the stored offset values. The digital offset estimation and compensation unit may be adapted to, when the second stored values switch is in a state to feed the digital offset estimation and compensation unit with the stored offset values, perform offset compensation of the time-interleaved analog-to-digital converter in the digital domain based on the stored offset values.

In some embodiments, the arrangement may further comprise an all analog offset compensation switch to bypass the digital offset estimation and compensation unit, and the analog offset estimation and compensation unit may be adapted to, when the all analog offset compensation switch is in a state to bypass the digital offset estimation and compensation unit: estimate a total computing channel specific offset for each of the plurality of computing channels, and perform offset compensation in the analog domain of each of the plurality of channels based on respective total computing channel specific offset.

In some embodiments, the second aspect of the invention may additionally have features identical with or corresponding to any of the various features as explained above for the first aspect of the invention.

A third aspect of the invention is an application specific integrated circuit comprising one or more arrangements according to the second aspect of the invention.

A fourth aspect of the invention is an electronic device comprising the one or more arrangements according to the second aspect of the invention.

In some embodiments, the electronic device may be a video analog front-end, a radio receiver, a television set, a liquid-crystal display, a computer monitor, a digital camera, a projector, a computer, a laptop, or a portable electronic device. An advantage of some embodiments of the invention is that proper offset compensation is provided for.

Another advantage of some embodiments of the invention is that proper gain compensation is provided for.

Another advantage of some embodiments of the invention is that offset mismatch between constituent ADCs compensated for.

Another advantage of some embodiments of the invention is that the effective signal range is kept at a maximum.

Another advantage of some embodiments of the invention is that the precision of the video signal after analog-to-digital conversion may be kept at a maximum.

Another advantage of some embodiments of the invention is that the offsets in the entire analog signal chain can be compensated for.

BRIEF DESCRIPTION OF THE DRAWINGS

Further objects, features and advantages of the invention will appear from the following detailed description of embodiments of the invention, with reference being made to the accompanying drawings, in which:

FIG. 3 is a flowchart illustrating example method steps according to some embodiments of the invention;

FIG. 4 is a flowchart illustrating example method steps according to some embodiments of the invention;

FIG. 5 is a flowchart illustrating example method steps according to some embodiments of the invention;

DETAILED DESCRIPTION

In the following, embodiments of the invention will be described where offset error compensation in a time-interleaved ADC (such as, for example, a parallel successive ADC) is obtained by employing means for offset error compensation in the analog domain and/or means for offset error compensation in the digital domain. Both mean offset error over all constituent ADCs (also referred to as computing channels) and offset error per constituent ADC may be compensated for. We will refer to offset error compensation as offset compensation and to gain error compensation as gain compensation.

Some embodiments of the invention combine offset compensation in the analog domain with offset compensation in the digital domain. For example, a mean offset for the computing channels may be compensated in the analog domain and the remaining (residual) offset per computing channel may be compensated in the digital domain. Embodiments of the invention may also estimate the mean and residual offsets.

In some embodiments, the entire offset compensation is performed in the analog domain. In some of these embodiments, only the offset per computing channel need be estimated. In some of these embodiments, only the mean offset for the computing channels need be estimated.

Performing at least part of the offset compensation in the analog domain has the effect that the effective signal range after analog-to-digital conversion is not affected (and hence not limited) by the (part of the) offset compensation performed in the analog domain.

To handle the possible diminishing of the effective signal range caused by offset compensation in the digital domain according to some embodiments of the invention, some embodiments employ a scaling of the signal range. The amount of scaling may depend on, for example, a maximal possible offset compensation in the digital domain. The signal range scaling may be performed after the analog-to-digital conversion and before the offset compensation in the digital domain. In some embodiments, the signal range is thereafter (after the offset compensation in the digital domain) limited again.

Such scaling arrangements may provide for that succeeding circuitry can operate on an expected effective signal range instead of a diminished effective signal range. In some embodiments, such scaling arrangements may also provide for a possibility to fully exploit the signal range and thus to enhance the signal quality after analog-to-digital conversion. In some embodiments, some codes (i.e. absolute signal levels) will not be present after such scaling, which may in fact reduce the signal quality with regard to dynamic range.

If, for example, a computing channel may be subject to a maximal offset compensation in the digital domain of +/−0.5% then the signal range may be scaled to 101% of its original range (for example, with equal expansion at both ends of the signal range).

Figure 1:
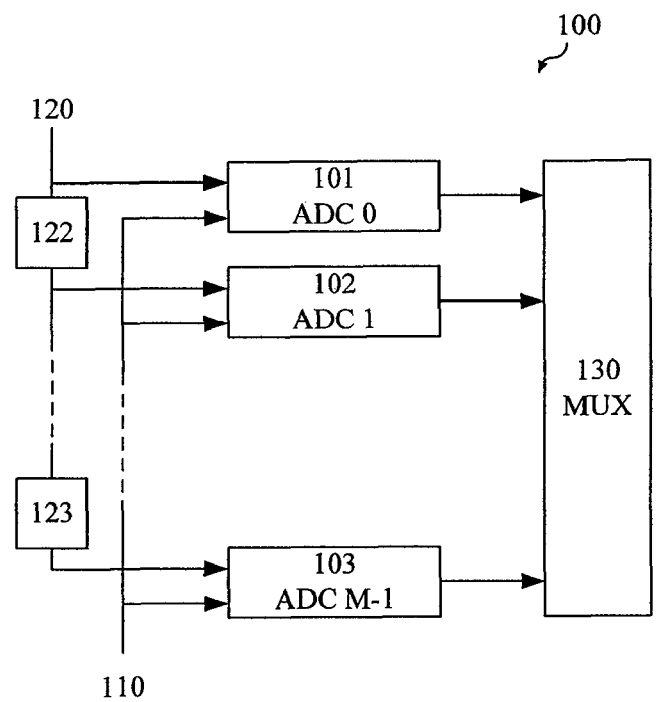
FIG. 1 is a block diagram illustrating an example time-interleaved analog-to-digital converter.
Figure 2:
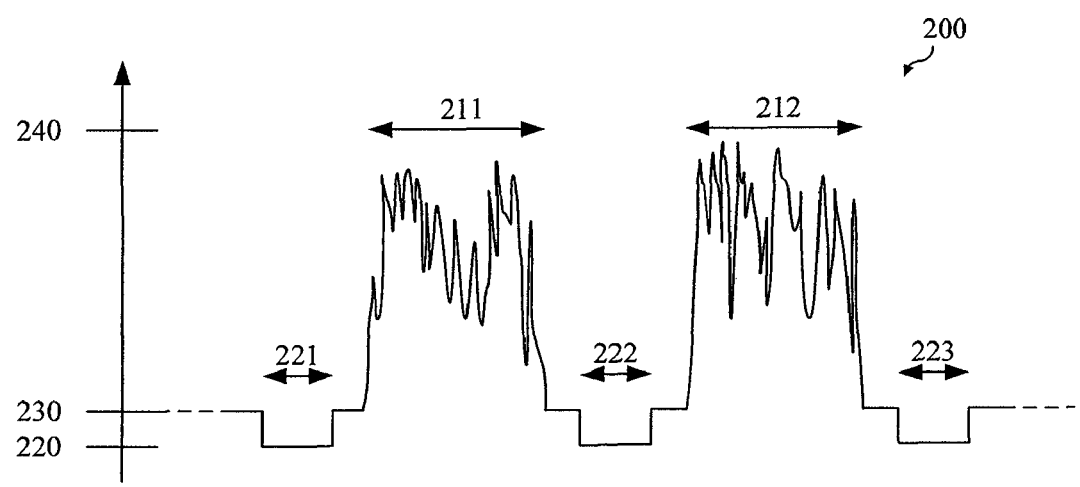
FIG. 2 is a schematic plot illustrating an example video signal.

In some embodiments, if the reference level 220 is below the black level 230 (referring to FIG. 2), range scaling may be advantageous to support such a reference level. Further, the amount of scaling may depend on the reference level 220 in such embodiments.

In some embodiments, range scaling may be applied to support offset compensation in the digital domain. In some embodiments, range scaling may be applied to support offset compensation in the analog domain. In some embodiments, range scaling may be applied to support offset compensation both in the analog and the digital domain.

Range scaling to support offset compensation in the analog domain may be useful if, for example, the target code is at (or close to or beyond) the upper or lower limit of the ADC signal range (e.g. if the target code is zero). In such cases, it is cumbersome to offset control a signal level to the upper or lower parts of the signal range if no range scaling is available without causing clipping phenomena.

In some embodiments, it may be possible to support a target code at (or close to or beyond) the upper or lower limit of the ADC signal range even without range scaling. This may, for example, be achieved by adding a separate offset value to the reference signal level such that the reference signal level (and thus the target code) is shifted from the value associated with the upper or lower limit of the ADC signal range to another value within the signal range, e.g. a value that is farther from the upper or lower limit of the ADC signal range.

After offset compensation in the digital domain, the signal range may be limited to its original range again according to some embodiments. In some embodiments, the signal range is not scaled, but nevertheless limited.

The signal range may be limited to less than the original signal range (for example, with equal limitation at both ends of the signal range, i.e. symmetrically around a mid code). In some embodiments, such a limited signal range may be shifted such that it starts at a starting value (which may or may not be fixed) and extends to a maximum value. The starting value may, for example, be zero or a positive value.

FIG. 3 illustrates an example method 300 for offset compensation according to some embodiments of the invention. The method starts in optional step 310, where the signal range may be scaled as explained above to account for the offset compensation to be performed in the digital domain. In step 320, the mean offset for all computing channels is estimated, and in step 330, the residual offset per computing channel is estimated. In step 340, the mean offset is compensated for in the analog domain and in step 350, the residual offsets are compensated for in the digital domain. Finally, in optional step 360, the signal range is limited again as explained above.

An example dividing up of the operations of method 300 between a digital offset compensation loop and an analog offset compensation (feedback) loop is also illustrated in FIG. 3. Optional method steps 310 and 360 are performed in the digital domain but are not part of the actual offset compensation loops in this example embodiment.

An analog offset compensation loop estimates the mean offset for all computing channels in step 320' and uses the estimate to compensate for the mean offset in the analog domain in step 340'. The mean offset estimation may be based on a range scaled signal. The estimation may comprise integrating a deviation signal over all computing channels and over time, as will be explained in more detail below.

A digital offset compensation loop estimates the offset per computing channel in step 315". The offset estimation may be based on a range scaled signal. The estimation may comprise integrating a deviation signal for each of the computing channels over time, as will be explained in more detail below. Then the mean of the offset per computing channel is calculated in step 320", and the residual offset per computing channel is calculated in step 330" by subtracting the mean offset from the offset per computing channel. In step 350", the residual offsets per computing channel are used for offset compensation in the digital domain.

FIG. 4 illustrates an example method 400 for estimating offset according to some embodiments of the invention. The method 400 may, for example, be comprised in one or more of method steps 320, 330, 320' and 315" as described in connection to FIG. 3.

In step 410, a reference signal (that is a signal with known signal characteristics) is subjected to analog-to-digital conversion by the time-interleaved ADC. The reference signal may, for example, be part of the signal subject to the analog-to-digital conversion. If, for example, the signal subject to the analog-to-digital conversion is the video signal shown in FIG. 2, the signal portions 221, 222, 223 having a reference signal level 220 may be used as reference signal.

In step 420, the analog-to-digital converted reference signal is compared with a calibration value for each of the computing channels. If signal range scaling is applied, step 420 may be performed after the signal range scaling of the analog-to-digital converted reference signal. The comparison may, for example, comprise computing a difference between the analog-to-digital converted reference signal and the calibration value for each of the computing channels to produce a deviation signal.

In step 430, the deviation signal is used to compute one or more offset estimates. The deviation signal may be integrated over time to compute an offset estimate. If the deviation signal is integrated over all computing channels, a mean offset estimate results. If the deviation signal is integrated over each computing channel separately, the result is an offset estimate per computing channel. Alternatively or additionally, the deviation signal may be subjected to filtering in the process of computing one or more offset estimates.

In some embodiments of the invention, offset values and/or gain compensation values may be estimated during or in connection with production of a time-interleaved ADC. The offset values estimated during or in connection with production may be offset per computing channel, mean offset and/or residual offset per computing channel. The gain compensation values may be different for different gain settings of an amplifier preceding the time-interleaved ADC. The estimated values may be stored in one or more memory units associated with the time-interleaved ADC and may be loaded and used for offset and/or gain compensation during operation of the time-interleaved ADC. If, for example, the time-interleaved ADC is implemented as an integrated circuit, then the one or more memory may be an on-chip memory, such as an OTP (one-time programmable) memory.

FIG. 5 shows a method 500 illustrating one embodiment of estimating gain compensation values and offset values during or in connection with production of a time-interleaved ADC. In step 510, the gain compensation values are estimated, and in step 520 the offset values are estimated. In step 530, the estimated values are stored in a memory for later loading and use in the operation of the time-interleaved analog-to-digital converter.

Gain and offset values may, for example, be estimated by applying two known (voltage) reference levels per gain setting to each analog input. The reference levels may preferably be chosen so that, for each gain setting, the ADC outputs are close to the top and bottom of their ranges but never saturated. The actual gain can then be estimated as the deviation of output code between the (two) reference levels divided by the voltage difference in the reference levels. The offset can be calculated as the mean code output of the (two) reference levels minus the expected value for these levels.

An analog front-end (AFE) may consist of more than one channel/ADC (each consisting of several constituent ADCs or computing channels) to, for example, take care of red, green and blue video signals. For such an AFE, the (e.g. red/green/blue) channels may be calibrated against absolute values of gain and offset or they may be calibrated such that they match gain and offset to each other. If they are to be calibrated to an absolute gain and offset value the measured data related to the calibration can be stored in a memory (e.g. OTP) directly. If they are expected to match each other, only the residual gain and offset values after subtracting mean gain and offset deviation, respectively, need to be stored in the memory.

Figure 6:
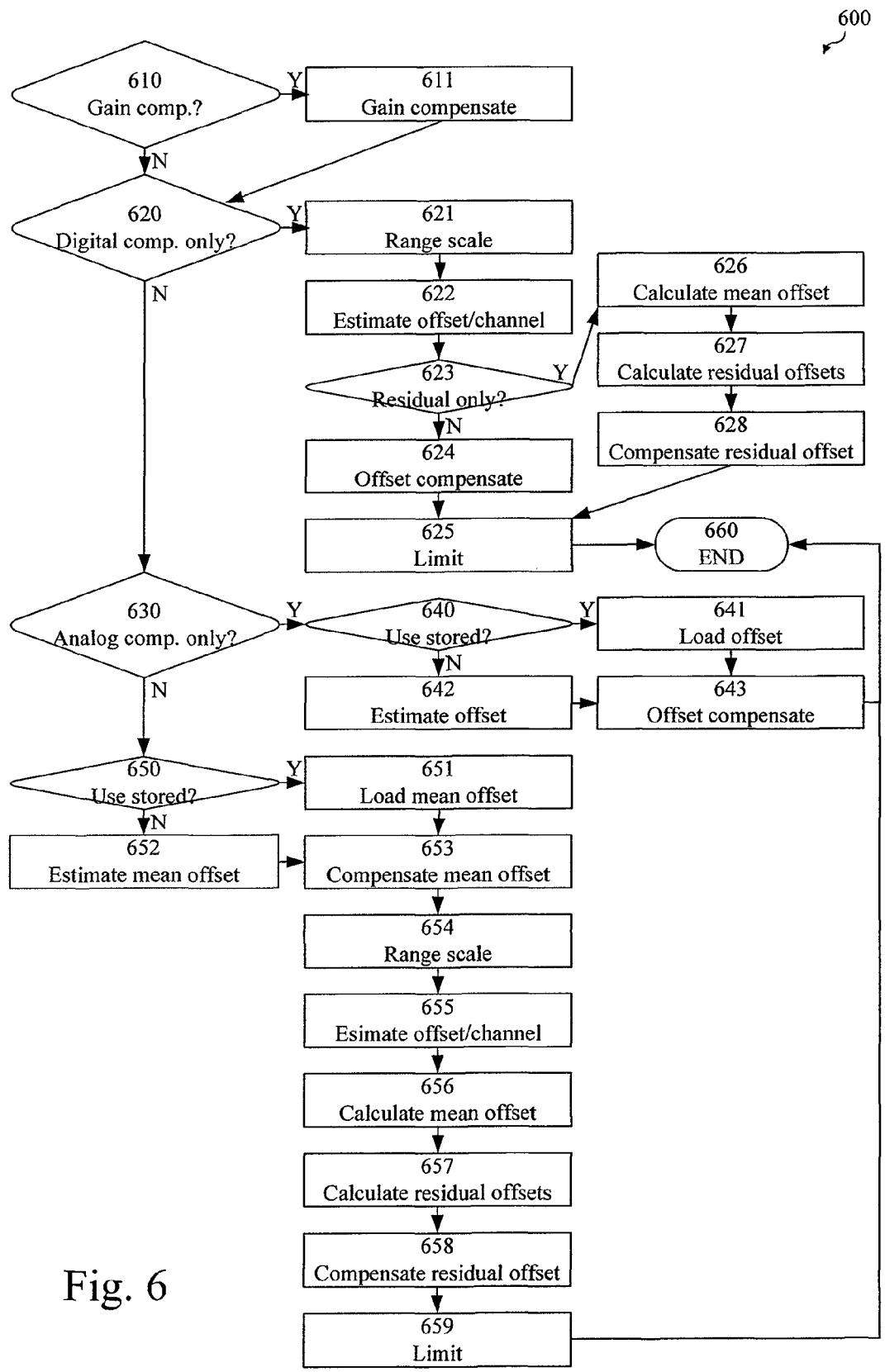
FIG. 6 is a flowchart illustrating example method steps according to some embodiments of the invention.

FIG. 6 illustrates an example method 600 for offset (and possibly gain) compensation according to some embodiments of the invention. The method starts in step 610, where it is determined if gain compensation is to be performed or not.

If gain compensation is to be performed (YES-path out of step 610), then the method continues to step 611. In this step, stored gain compensation values may be loaded from a memory unit and used for gain compensation of the time-interleaved ADC. The stored gain compensation values may have been estimated during or in connection with production of a time-interleaved ADC as described above. There may be one gain compensation value per amplifier setting and per computing channel. Then the method proceeds to step 620.

If gain compensation is not to be performed (NO-path out of step 610), then the method continues directly to step 620, where it is determined if the offset compensation is to be performed entirely in the digital domain.

If the offset compensation is to be performed entirely in the digital domain (YES-path out of step 620), then the method proceeds to step 621, where the signal range is scaled as described above (e.g. in connection to method step 310 of FIG. 3). Then the total offset per computing channel is estimated in step 622. The estimation may, for example, comprise the method 400 of FIG. 4. In step 623, it is determined whether total offset per computing channel is to be compensated for or if only residual offset per computation channel is to be compensated for.

If total offset per computing channel is to be compensated for (NO-path out of step 623) then the method proceeds to step 624. In step 624, the estimates of the total offset per computing channel are used to compensate for offset entirely in the digital domain. Steps 622 and 624 may be performed by a digital offset compensation loop.

If residual offset per computing channel is to be compensated for (YES-path out of step 623) then the method proceeds to step 626, where the mean offset is calculated. The residual offset per computation channel is calculated in step 627. The calculations in steps 626 and 627 may, for example, correspond to method steps 320" and 330" of FIG. 3. In step 628, the estimates of the residual offset per computing channel are used to compensate for residual offset in the digital domain.

Then the signal range may be limited again in step 625 as described above (e.g. in connection to method step 360 of FIG. 3), and the method ends in step 660.

If the offset compensation is not to be performed entirely in the digital domain (NO-path out of step 620), then the method proceeds to step 630, where it is determined if the offset compensation is to be performed entirely in the analog domain.

If the offset compensation is to be performed entirely in the analog domain (YES-path out of step 620), then the method proceeds to step 640, where it is determined if stored offset values should be used. If stored offset values should be used (YES-path out of step 640), then the method continues to step 641, where stored offset values are loaded and the method proceeds to step 643. The stored offset values may comprise estimates of the total offset per computing channel and/or estimates of the mean offset for the computing channels. If stored offset values should not be used (NO-path out of step 640), then the method continues to step 642, where the total offset per computing channel and/or the mean offset for the computing channels is estimated. The estimation may, for example, comprise the method 400 of FIG. 4. In step 643, the offset estimates (from either step 641 or 642) are used to compensate for offset entirely in the analog domain. Thus, the offset compensation in step 643 may compensate only for the mean offset for the computing channels, or for the total offset per computing channel. Steps 642 and 643 may be performed by an analog offset compensation loop. Then, the method ends in step 660.

If the offset compensation is not to be performed entirely in the analog domain (NO-path out of step 630), then the method proceeds to step 650, where it is determined if stored offset values should be used. If stored offset values should be used (YES-path out of step 650), then the method continues to step 651, where stored offset values are loaded and the method proceeds to step 653. The stored offset values may comprise an estimate of the mean offset. If stored offset values should not be used (NO-path out of step 650), then the method continues to step 652, where the mean offset is estimated. The estimation may, for example, comprise the method 400 of FIG. 4. In step 653, the estimate of the mean offset (from either step 651 or 652) is used to compensate for mean offset in the analog domain. Steps 652 and 653 may be performed by an analog offset compensation loop.

Then, the method proceeds to step 654, where the signal range is scaled as described above (e.g. in connection to method step 310 of FIG. 3). The total offset per computing channel is estimated in step 655. The mean offset is calculated in step 656, and the residual offset per computation channel is calculated in step 657. The estimation in step 655 may, for example, comprise the method 400 of FIG. 4. The calculations in steps 656 and 657 may, for example, correspond to method steps 320" and 330" of FIG. 3. In step 658, the estimates of the residual offset per computing channel are used to compensate for residual offset in the digital domain. Steps 655, 656, 657 and 658 may be performed by a digital offset compensation loop. Then, the signal range may be limited again in step 659 as described above (e.g. in connection to method step 360 of FIG. 3), and the method ends in step 660.

As touched upon earlier, the signal range may be limited even if the range scaling steps 621 and/or 654 are omitted.

Further, and also touched upon earlier, the signal range may be limited to less than the original signal range. In some embodiments, such a limited signal range may be shifted (or offset) such that it starts at a starting value and extends to a maximum value. The starting value may be zero. Such shifting may be part of the operations in steps 625 and/or 659.

A possibility not touched upon in FIG. 6 is to have residual offsets per computing channel stored in a memory as described earlier. In these embodiments, the stored residual offset values may be loaded from the memory instead of being calculated in steps 622, 626, 627 and/or steps 655, 656, 657.

In some embodiments, range scaling may be applied to support offset compensation in the analog domain. This may be useful if, for example, the target code is at (or close to) the upper or lower limit of the ADC signal range (e.g. if the target code is zero). In such cases, it is cumbersome to offset control a signal level to the upper or lower parts of the signal range if no range scaling is available without causing clipping phenomena.

Thus, in some embodiments (not shown in FIG. 6), the range scaling 621, 654 may be performed prior to step 620. Thus, in such embodiments, the range scaling can always be performed, and not only if offset compensation is performed in the digital domain.

Figure 7A:
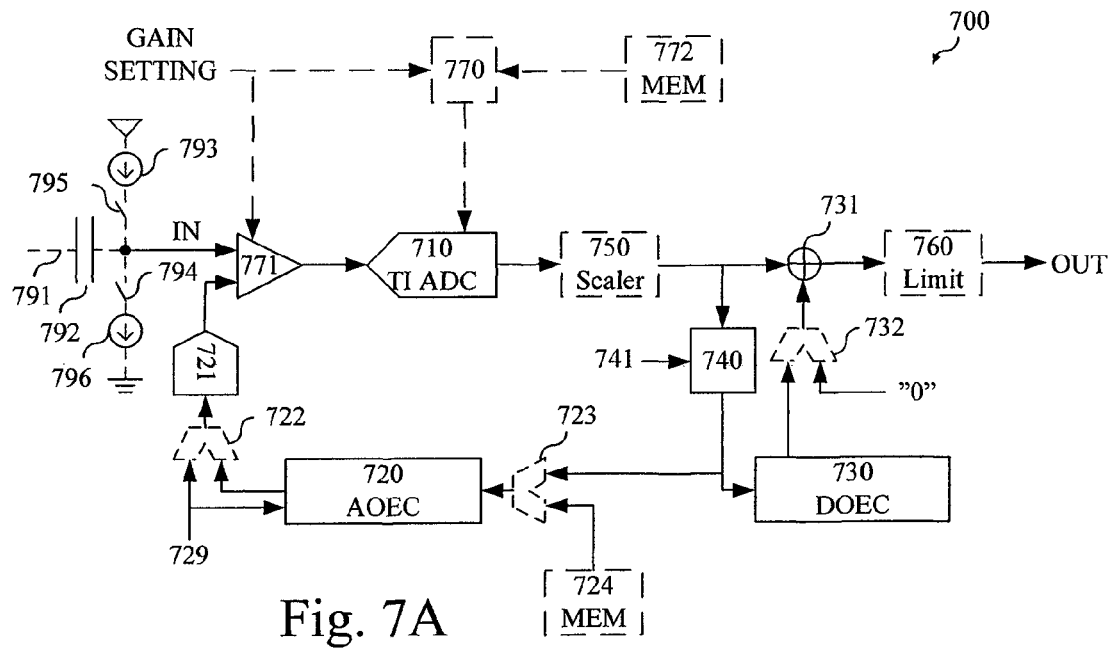
FIGS. 7A, 7B and 7C are block diagrams illustrating example arrangements according to some embodiments of the invention.

FIG. 7A illustrates an example arrangement 700 for offset compensation of a time-interleaved ADC (TI ADC) 710. The arrangement 700 (or parts of it) may, for example, perform method steps as described in connection to FIGS. 3-6. The arrangement 700 may be comprised in an analog front end.

The arrangement comprises the time-interleaved ADC 710, an analog offset estimation and compensation unit (AOEC—Analog Offset and Error Correction) 720 in a feedback loop and a digital offset estimation and compensation unit (DOEC—Digital Offset and Error Correction) 730 in a feed-forward loop.

The AOEC 720 may be adapted to estimate offset values as described above. The AOEC 720 may also be adapted to load (via a switch 723) stored offset values from a memory (MEM) 724 instead of estimating them. Such stored offset values may have been estimated during or in connection with production of the arrangement 700. The stored or estimated offset values may be a mean offset over the computing channels and/or an offset per computing channel. The AOEC 720 is connected to an offset DAC (digital-to-analog converter) 721. The offset DAC 721 may also have a nominal offset (reference) 729 as an input, in which case the AOEC output is added to the nominal offset to produce an offset DAC output. In other embodiments (and as shown in FIG. 7A) the nominal offset 729 may be supplied to the AOEC 720, in which case the offset value estimated by the AOEC 720 is added to the nominal offset to produce AOEC output. In any case, the output of the offset DAC 721 is supplied as one input to an amplifier 771 preceding the time-interleaved ADC 710 to achieve offset compensation in the analog domain. The other input to the amplifier is the signal to be analog-to-digital converted. The AOEC 720 may also be by-passed (via switch 722) so that the offset DAC 721 is only fed the nominal offset value and so that offset compensation is performed entirely in the digital domain.

The DOEC 730 may be adapted to estimate offset values as described above. The estimated offset values may be an offset per computing channel and/or a residual offset per computing channel. The DOEC 730 is connected to an offset compensation adder 731 to achieve offset compensation in the digital domain. The DOEC 730 may also be by-passed (via switch 732) so that offset compensation is performed entirely in the analog domain.

The arrangement 700 further comprises a comparing unit 740, which compares a calibration value 741 with a reference signal after analog-to-digital conversion to produce a deviation signal. The comparing unit 740 may, for example, calculate a difference between the calibration value 741 and the reference signal. The deviation signal is supplied to the AOEC 720 and the DOEC 730.

The arrangement 700 may further comprise a range scaler 750 and a limiter 760, which may be adapted to scale and limit a signal range in relation to a maximum amount of offset compensation in the digital domain as described above.

In some embodiments, the arrangement also comprises a gain compensation unit 770, which may comprise a gain tune digital-to-analog converter. The gain compensation unit 770 may be adapted to load stored gain compensation values from a memory (MEM) 772 (which may or may not be identical to memory 724). Such stored gain compensation values may have been estimated during or in connection with production of the arrangement 700. The stored gain compensation values may be a gain compensation value per computing channel and per gain setting of the amplifier 771. The gain compensation unit 770 is connected to the time-interleaved ADC 710 to achieve gain compensation.

In some embodiments, current clamping is used to set a reference level of the internal video signal (as input to the amplifier 771) to a fixed and suitable value. In FIG. 7A, an external video signal may be input at 791 and an optional current clamping implementation 792, 793, 794, 795, 796 is illustrated, which very slowly charges or discharges a capacitor 792 so that the internal voltage approaches the desired level. The clamp controller 794, 795 may or may not be comprised in the arrangement 700. For example, the clamp controller may be implemented outside a chip comprising the arrangement 700 or outside an AFE comprising the arrangement 700. The clamp controller may operate based only on the digitized level. Further, the clamp controller may not have knowledge about the offset estimation and compensation performed internally by the AOEC 720 and/or by the DOEC 730.

Current clamping may remove common offsets so that only slice-to-slice offsets (i.e. residual offset per computation channel) need to be corrected by the AOEC 720 and/or by the DOEC 730. In fact, an internal offset regulation by the AOEC 720 and/or by the DOEC 730 based on offsets common to the computation channels may interfere with the outer clamping control so that a good regulation may be prohibited.

During calibration capture (block 740), the current clamping may need to be gated so that the reference level is equal for each constituent ADC. Otherwise the internal offset estimation and compensation may interpret the capacitor ramp as different offsets for different constituent ADCs, which would add a slice-to-slice pattern after offset compensation.

Figure 7B:
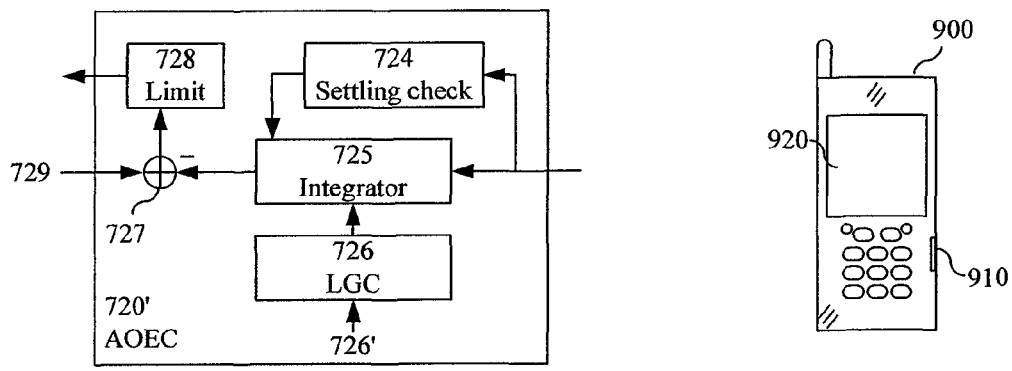

FIG. 7B illustrates an example implementation of an AOEC 720', such as the AOEC 720 of FIG. 7A.

In AOEC 720', a deviation signal is input to a settling check unit 724. The settling check unit 724 determines whether or not the offset has converged to a stable value. If it has converged, the settling check unit 724 may freeze the offset control. These operations may, for example, eliminate fluctuations that may arise if the offset DAC 721 is toggled between two neighboring offset levels (e.g. if the optimal offset level is just in between the two neighboring offset levels and cannot be achieved due to limitations in the DAC resolution).

The deviation signal is also input to an integrator 725. The integrator 725 may, for example, render possible an iterative integrating offset control. In this way, an offset can be accurately compensated for even if the analog loop gain is not exactly known.

A loop gain correction unit (LGC) 726 may be provided that determines a loop gain correction value based on a number of input values 726'. The loop gain correction value is supplied to the integrator 725 and aims at stabilizing the AOEC feedback loop and at adjusting integration parameters of the integrator 725 (e.g. correcting the loop gain to keep a desired settling response of the mean value calculation in the integrator, a desired noise suppression and a desired stability). The loop gain correction value may, for example, account for noise figures and response times. The input values 726' may comprise a desired response value (or a desired response time) and data related to settings of the arrangement where the AOEC 720' is used (such as amplifier gain settings, sample frequency, sample frequency per slice and AOEC gain).

The integrated deviation signal is output to an adder 727, which adds (or calculates the difference between) a nominal value 729 and the integrated deviation signal. The thus calculated offset value may be limited in limiter 728 to prevent over- and/or underflow in a succeeding offset DAC (such as 721). In other implementations, the adder 727 may be integral to a succeeding offset DAC instead.

Some embodiments also provides for an update timing signal (not shown in the Figures) related to the offset DAC. The update timing signal aims at activating an offset value update during periods where the video signal does not comprise information-bearing portions (such as portions 211, 212 of FIG. 2). If an offset value update is performed during periods where the video signal comprises information-bearing portions a visible contour in the rendered picture may result. The update timing signal may be based on a vertical synchronization signal, a horizontal synchronization signal and a pixel clock.

As mentioned before, offset correction may be cumbersome if the reference level and target code is on or outside the signal range of the signal to which the target code is to be compared. The signal whose range is referred to here is the scaled ADC output signal (i.e. the signal input to block 740 as will be explained later in connection to FIG. 7A). This problem may be due to the fact that it will not be possible to distinguish signals on the signal range limit from signals far outside the range limit since the same code will be output for both cases.

Using scaling (expansion) may increase the range of the signal so that, for example, the zero code will lie within the signal range. Expanding the range to thus ease analog offset compensation may, however, cause a loss of available codes after limiting the signal range unless the ADC has redundant resolution (i.e. extra bits).

One alternative way around the problem with references on or outside the signal range is to add a (well-defined) offset to the ADC input signal during the reference periods (221, 222, 223 of FIG. 2) before it is digitized so that the digitized reference signal is moved into the ADC signal range. The added offset (or a value associated with the added offset) may be subtracted again in the digital domain (after the ADC). The net effect of this is thus that the ADC signal range is adjusted up-wards or down-wards during the capture of the reference signal so that the reference signal can be captured within the ADC signal range.

The choice of range shift value (added offset) may, for example, be $-M$ (where M is a positive value) if the target code is larger than the upper limit of the ADC signal range minus some non-negative value (m), $+M$ if the target code is smaller than the lower limit of the ADC signal range plus m, and zero otherwise. The shift may thus be implemented such that an input voltage is moved by M binary codes into the signal range.

In some embodiments, the shifted ADC output after the subtraction in the digital domain may have additional bit(s) compared to the ADC output in order to manage both the original ADC signal range and the shifted signal range.

Figure 7C:
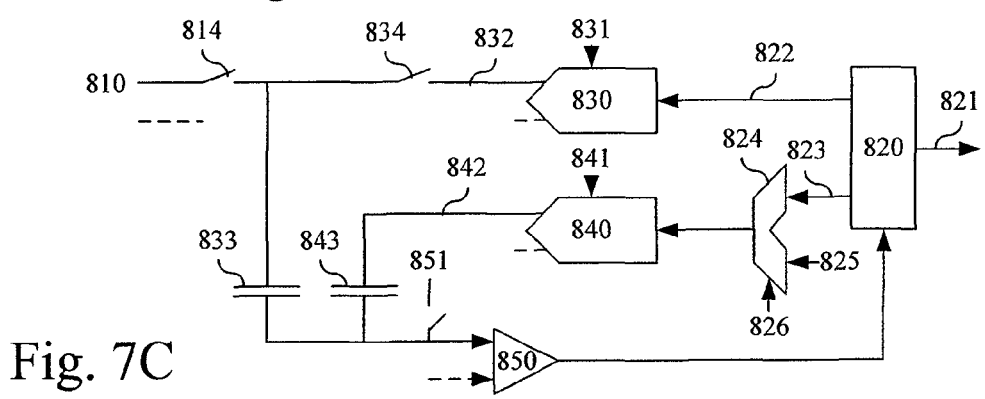

Accurate removal of the analog range shift in the digital domain may be facilitated if the analog range shift value is well defined. If the analog range shift is not accurate an additional offset may be added which may ruin the entire offset correction. In one embodiment, when a successive approximation ADC employing two or more successive approximation DAC stages is used, one of the later DACs may be offset in the ADC during the sampling of the signal. FIG. 7C illustrates such an arrangement of a differential ADC employing two DAC stages. For simplicity, only the positive analog signal branch is shown in FIG. 7C and the presence of a negative analog signal branch is indicated by dashed lines.

The positive analog signal is input at 810 and sampled at 814, thus reaching capacitor 833. Sampling 834 is the inverse of sampling 814, thus enabling the output 832 of the coarse DAC 830 to reach capacitor 833. The output 842 of fine DAC 840 is coupled to capacitor 843. Capacitors 833 and 834 are coupled to the positive input of amplifier 850, whose output is input to the successive approximation logic and register unit 820.

The two DACs 830 and 840 (coarse and fine respectively) are accurately weighted by the capacitor ratio of capacitors 833 and 843 and their reference voltages so that the coarse DAC 830 converts the most significant bits 822 and the fine DAC converts the least significant bits 823. Each of the DACs 830 and 840 are fed with coarse and fine references 831 and 841 respectively.

In normal operation the fine DAC 840 may be fed by its mid code value 825 during the sampling of the signal so that the ADC center code corresponds to a zero differential input value. This is accomplished by multiplexer 824 controlled by the sampling signal at 826. Any digital code deviation from the fine DAC mid code during sampling will introduce an analog offset that (with high precision) corresponds to an offset at the ADC output 821 that is equal to the weight of the fine DAC code deviation. When only two DACs are used, the weight of the fine DAC bits is usually the same as the ADC output bits.

A time-interleaved ADC structure sharing the same references for all parallel ADC channels may, if this approach is used, have essentially identical range shifts for all parallel ADC channels. Thus, no significant channel-to-channel offset is introduced.

Embodiments of the invention may be suitable for analog-to-digital conversion of audio signals, video signals, or audio/video signals.

The described embodiments of the invention and their equivalents may be realized in software or hardware or a combination thereof. They may be performed by general-purpose circuits associated with or integral to a communication device, such as digital signal processors (DSP), central processing units (CPU), co-processor units, field-programmable gate arrays (FPGA) or other programmable hardware, or by specialized circuits such as for example application-specific integrated circuits (ASIC). They may be implemented in, for example, a video AFE. All such forms are contemplated to be within the scope of the invention.

The invention may be embodied within an electronic apparatus comprising circuitry/logic or performing methods according to any of the embodiments of the invention. The electronic apparatus may, for example, be a television set, a liquid-crystal display, a computer monitor, a digital camera, a projector, a computer, a laptop, a radio receiver or a portable electronic device.

Figure 8:
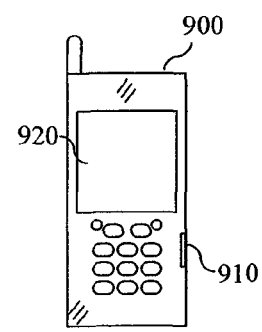
FIG. 8 is a schematic illustration of an example device comprising an arrangement according to some embodiments of the invention.

FIG. 8 illustrates an example electronic device 900 comprising one or more arrangements, such as the arrangement 700 of FIG. 7A. The example electronic device 900 also comprises one or more input ports 910 for supplying an input signal, such as a video signal, to the one or more arrangements. Before the input signal is supplied to the one or more arrangements, it may undergo analog signal processing, such as possibly down-conversion from a carrier frequency, filtering, de-multiplexing, etc. After the input signal has been analog-to-digital converted in the one or more arrangement, it may be further processed in the digital domain. Finally, the, thus processed, input signal may be rendered by the example electronic device 900 through a rendering interface, such as a display 920.

The invention has been described herein with reference to various embodiments. However, a person skilled in the art would recognize numerous variations to the described embodiments that would still fall within the scope of the invention. For example, the method embodiments described herein describes example methods through method steps being performed in a certain order. However, it is recognized that these sequences of events may take place in another order without departing from the scope of the invention. Furthermore, some method steps may be performed in parallel even though they have been described as being performed in sequence.

In the same manner, it should be noted that in the description of embodiments of the invention, the partition of functional blocks into particular units is by no means limiting to the invention. Contrarily, these partitions are merely examples. Functional blocks described herein as one unit may be split into two or more units. In the same manner, functional blocks that are described herein as being implemented as two or more units may be implemented as a single unit without departing from the scope of the invention.

Hence, it should be understood that the limitations of the described embodiments are merely for illustrative purpose and by no means limiting. Instead, the scope of the invention is defined by the appended claims rather than by the description, and all variations that fall within the range of the claims are intended to be embraced therein.

The invention claimed is:

1. A method of offset compensation of a time-interleaved analog-to-digital converter, having a plurality of computing channels and being adapted to convert a signal from an analog domain to a digital domain, comprising:
   estimating a mean offset for the plurality of computing channels;
   estimating a residual computing channel specific offset for each of the plurality of computing channels;
   performing offset compensation in the analog domain of each of the plurality of channels based on the estimated mean offset in the analog domain; and
   performing offset compensation in the digital domain of each of the plurality of channels based on respective residual computing channel specific offset.

2. The method of claim 1, further comprising scaling a signal range of the signal based on a scaling value dependent on a maximum amount of offset compensation that can be performed in the digital domain before performing offset compensation in the digital domain.

3. The method of claim 1, further comprising scaling a signal range of the signal based on a scaling value dependent on a reference signal level before performing offset compensation in the analog domain.

4. The method of claim 1, further comprising shifting a signal range of the signal based on a shift value dependent on a reference signal level before performing offset compensation in the analog domain.

5. The method of claim 1, further comprising limiting a signal range of the analog-to-digital converted signal after performing offset compensation in the digital domain.

6. The method of claim 5, wherein the signal range is limited symmetrically around a mid code.

7. The method of claim 5, wherein the limited signal range is shifted such that the shifted, limited signal range starts at a starting value.

8. The method of claim 7, wherein the starting value is a fixed, non-negative value.

9. The method of claim 1, wherein the step of estimating the mean offset for the plurality of computing channels is performed in association with a process of producing the time-interleaved analog-to-digital converter.

10. The method of claim 1, wherein the step of estimating the mean and residual offsets for the plurality of computing channels comprises:
   for each of the plurality of computing channels:
      analog-to-digital converting a reference signal; and
      comparing a calibration value with the analog-to-digital converted reference signal; and
   estimating the mean and residual offsets based on a result of the comparisons.

11. The method of claim 10, further comprising turning off a current clamping during the steps of analog-to-digital converting the reference signal and comparing the calibration value with the analog-to-digital converted reference signal.

12. The method of claim 1, further comprising:
   estimating, in association with a process of producing the time-interleaved analog-to-digital converter, a gain compensation value for each of a plurality of gain settings of the time-interleaved analog-to-digital converter; and
   performing gain compensation of the time-interleaved analog-to-digital converter based on the estimated gain compensation values and a current gain setting.

13. An arrangement for offset compensation of a time-interleaved analog-to-digital converter, having a plurality of computing channels and being adapted to convert a signal from an analog domain to a digital domain, comprising:
- a time-interleaved analog-to-digital converter;
- an analog offset estimation and compensation unit adapted to estimate a mean offset for the plurality of computing channels;
- a digital offset estimation and compensation unit adapted to estimate a respective residual computing channel specific offset for each of the plurality of computing channels; and
- offset compensation means adapted to:
  - perform offset compensation in the analog domain of each of the plurality of channels based on the estimated mean offset in the analog domain; and
  - perform offset compensation in the digital domain of each of the plurality of channels based on the respective residual computing channel specific offset.

14. The arrangement of claim 13, wherein the analog offset estimation and compensation unit comprises:
- an offset integration unit adapted to determine the estimated mean offset by integration;
- a settling check unit adapted to determine whether the estimated mean offset has converged; and
- a loop gain correction unit adapted to determine one or more integration parameters associated with the offset integration unit.

15. The arrangement of claim 13, further comprising an update timing controller adapted to determine an update time for a value of the estimated mean offset.

16. The arrangement of claim 13, further comprising an amplifier preceding the time-interleaved analog-to-digital converter, and wherein the offset compensation means comprises an offset digital-to-analog converter having an input connected to an output of the analog offset estimation and compensation unit and an output connected to an input of the amplifier for performing offset compensation in the analog domain.

17. The arrangement of claim 13, further comprising:
- a first memory having stored thereon a gain compensation value, estimated in association with a process of producing the time-interleaved analog-to-digital converter, for each of a plurality of gain settings of the amplifier; and
- gain compensation means adapted to perform gain compensation of the time-interleaved analog-to-digital converter based on the estimated gain compensation values and a current gain setting.

18. The arrangement of claim 13, wherein the offset compensation means comprises an adder having an input connected to an output of the digital offset estimation and compensation unit and another input associated with an output of the time-interleaved analog-to-digital converter for performing offset compensation in the digital domain.

19. The arrangement of claim 13, further comprising a range scaler associated with an output of the time-interleaved analog-to-digital converter, with an input of the analog offset estimation and compensation unit and with an input of the digital offset estimation and compensation unit, and adapted to scale a signal range of the analog-to-digital converted signal based on a scaling value dependent on a maximum amount of offset compensation that can be performed in the digital domain.

20. The arrangement of claim 13, further comprising a range scaler associated with an input of the time-interleaved analog-to-digital converter, and adapted to scale a signal range of the signal based on a scaling value dependent on a reference signal level at the input of the time-interleaved analog-to-digital converter.

21. The arrangement of claim 13, further comprising a range shifter associated with an input of the time-interleaved analog-to-digital converter, and adapted to shift a signal range of the signal based on a shift value dependent on a reference signal level at the input of the time-interleaved analog-to-digital converter.

22. The arrangement of claim 13, further comprising a signal range limiter associated with an output of the digital offset estimation and compensation unit.

23. The arrangement of claim 22, wherein the limiter is adapted to limit the signal range symmetrically around a mid code.

24. The arrangement of claim 22, further comprising circuitry adapted to shift the limited signal range such that the shifted, limited signal range starts at a starting value.

25. The arrangement of claim 24, wherein the starting value is a fixed, non-negative value.

26. The arrangement of claim 13,
- further comprising a comparing unit adapted to compare a calibration value with an analog-to-digital converted reference signal;
- wherein the analog offset estimation and compensation unit is adapted to estimate the mean offset based on an output of the comparing unit; and
- wherein the digital offset estimation and compensation unit is adapted to estimate the residual computing channel specific offset based on an output of the comparing unit.

27. The arrangement of claim 26, further comprising:
- a current clamping; and
- a current clamping controller adapted to turn off the current clamping during the comparison by the comparing unit of the calibration value with the analog-to-digital converted reference signal.

28. The arrangement of claim 13,
- further comprising a bypass switch for bypassing the analog offset estimation and compensation unit; and
- wherein the digital offset estimation and compensation unit is adapted, when the bypass switch is in a state to bypass the analog offset estimation and compensation unit, either to:
  - estimate a total computing channel specific offset for each of the plurality of computing channels; and perform offset compensation in the digital domain of each of the plurality of channels based on respective total computing channel specific offset; or to
  - estimate a residual computing channel specific offset for each of the plurality of computing channels; and perform offset compensation in the digital domain of each of the plurality of channels based on respective residual computing channel specific offset.

29. The arrangement of claim 13, further comprising:
- a second memory having stored thereon offset values, estimated in association with a process of producing the time-interleaved analog-to-digital converter; and
- a first stored values switch for feeding the analog offset estimation and compensation unit with the stored offset values, the analog offset estimation and compensation unit being adapted to, when the first stored values switch is in a state to feed the analog offset estimation and compensation unit with the stored offset values, perform offset compensation of the time-interleaved analog-to-digital converter in the analog domain based on the stored offset values; and/or
- a second stored values switch for feeding the digital offset estimation and compensation unit with the stored offset values, the digital offset estimation and compensation unit being adapted to, when the second stored values switch is in a state to feed the digital offset estimation and compensation unit with the stored offset values, perform offset compensation of the time-interleaved analog-to-digital converter in the digital domain based on the stored offset values.

30. The arrangement of claim 13, further comprising an all analog offset compensation switch to bypass the digital offset estimation and compensation unit; and wherein the analog offset estimation and compensation unit is adapted to, when the all analog offset compensation switch is in a state to bypass the digital offset estimation and compensation unit:

estimate a total computing channel specific offset for each of the plurality of computing channels; and perform offset compensation in the analog domain of each of the plurality of channels based on respective total computing channel specific offset.

31. An application specific integrated circuit comprising one or more arrangements according to claim 13.

32. An electronic device comprising the one or more arrangements according to claim 13.

33. The electronic device of claim 32, wherein the electronic device is a video analog front-end, a radio receiver, a television set, a liquid-crystal display, a computer monitor, a digital camera, a projector, a computer, a laptop, or a portable electronic device.

* * * * *

UNITED STATES PATENT AND TRADEMARK OFFICE
CERTIFICATE OF CORRECTION

| | | |
|---|---|---|
| PATENT NO. | : 8,212,697 B2 | |
| APPLICATION NO. | : 12/815882 | |
| DATED | : July 3, 2012 | |
| INVENTOR(S) | : Jansson Christer et al. | |

It is certified that error appears in the above-identified patent and that said Letters Patent is hereby corrected as shown below:

In Claim 29, Col. 18, line 53, please delete the word "second".

Signed and Sealed this
Fourth Day of December, 2012

David J. Kappos
*Director of the United States Patent and Trademark Office*